(12) United States Patent
Gaide et al.

(10) Patent No.: US 8,773,166 B1
(45) Date of Patent: Jul. 8, 2014

(54) SELF-TIMED SINGLE TRACK CIRCUIT

(71) Applicant: Xilinx, Inc., San Jose, CA (US)

(72) Inventors: Brian C. Gaide, Longmont, CO (US);
Steven P. Young, Boulder, CO (US)

(73) Assignee: Xilinx, Inc., San Jose, CA (US)

( * ) Notice: Subject to any disclaimer, the term of this patent is extended or adjusted under 35 U.S.C. 154(b) by 90 days.

(21) Appl. No.: 13/666,236

(22) Filed: Nov. 1, 2012

(51) Int. Cl.
*H03K 19/0175* (2006.01)
(52) U.S. Cl.
USPC .................. 326/86; 326/82; 326/38; 326/93
(58) Field of Classification Search
USPC .................................. 326/82, 86, 93, 38–41
See application file for complete search history.

(56) References Cited

U.S. PATENT DOCUMENTS

| | | | | |
|---|---|---|---|---|
| 5,614,868 | A * | 3/1997 | Nielson | 331/1 A |
| 6,356,117 | B1 * | 3/2002 | Sutherland et al. | 326/93 |
| 6,590,424 | B2 * | 7/2003 | Singh et al. | 326/93 |
| 6,958,627 | B2 * | 10/2005 | Singh et al. | 326/93 |
| 7,605,604 | B1 | 10/2009 | Young | |
| 7,746,110 | B1 | 6/2010 | Gaide et al. | |
| 7,759,974 | B1 * | 7/2010 | Young | 326/41 |
| 7,913,007 | B2 * | 3/2011 | Singh et al. | 710/105 |
| 8,051,396 | B2 * | 11/2011 | Beerel et al. | 716/104 |
| 8,294,490 | B1 * | 10/2012 | Kaviani | 326/41 |
| 8,575,959 | B2 * | 11/2013 | Manohar et al. | 326/39 |
| 2002/0069347 | A1 * | 6/2002 | Singh et al. | 712/216 |

OTHER PUBLICATIONS

U.S. Appl. No. 12/896,742, filed Oct. 1, 2010, Kaviani.
U.S. Appl. No. 12/896,720, filed Oct. 1, 2010, Kaviani.
U.S. Appl. No. 13/666,271, filed Nov. 1, 2012, Gaide et al.
Ferretti, Marcos et al., "Single-Track Asynchronous Pipeline Templates Using 1-of-N Encoding," *Proc. of the 2002 Design, Automation and Test in Europe Conference and Exhibition*, Mar. 4, 2002, pp. 1008-1015, IEEE Computer Society, Washington, DC, USA.
Nyström, Mika, "Asynchronous Pulse Logic" thesis, May 14, 2001, pp. 1-223, California Institute of Technology, Pasadena, California, USA.

* cited by examiner

*Primary Examiner* — Vibol Tan
(74) *Attorney, Agent, or Firm* — W. Eric Webostad

(57) ABSTRACT

An apparatus includes a first output stage and a first input stage of a first single track buffer, as well as a second output stage and a second input stage of a second single track buffer. The second single track buffer is downstream from the first single track buffer. The first output stage and the second input stage are coupled to one another via bidirectional rails. The first output stage and the second input stage in combination provide a first pulse generator.

20 Claims, 9 Drawing Sheets

SELF-TIMED SINGLE TRACK CIRCUIT

TECHNICAL FIELD

An embodiment relates to integrated circuit devices ("ICs"). More particularly, an embodiment relates to a self-timed single track circuit for an IC.

BACKGROUND

Increasingly, high-speed synchronous design encounters significant problems with regard to clock skew, clock distribution, and/or on-chip communication in ICs employing small densely packed transistors. Asynchronous circuits may be event driven rather than clock driven. Thus, asynchronous circuits are promising for ICs employing small densely packed transistors. Hence, it is desirable and useful to provide asynchronous circuits for such ICs.

SUMMARY

An apparatus includes a first output stage and a first input stage of a first single track buffer, as well as a second output stage and a second input stage of a second single track buffer. The second single track buffer is downstream from the first single track buffer. The first output stage and the second input stage are coupled to one another via bidirectional rails. The first pulse generator has a signal pulse width which is independent of a signal pulse width of a second pulse generator. The first output stage and the second input stage in combination provide a first pulse generator.

Another apparatus includes an input stage including a first input rail and a second input rail. An output stage is coupled to the input stage. The output stage includes a first output rail and a second output rail. The input stage includes an input driver. The output stage includes an output driver. A first feedback loop and a second feedback loop each go from the output stage to the input stage. Each of the first feedback loop and the second feedback loop includes a latch of the input stage. The input driver is controlled by output of the latch.

Yet another apparatus includes a single track buffer having an input stage and a first output stage. A second output stage is coupled to the input stage. The input stage includes a first input rail and a second input rail. The first output stage and the second output stage are coupled to the input stage via a first fork of the first input rail and a second fork of the second input rail. The first output stage includes a first output rail and a second output rail. The second output stage includes a third output rail and a fourth output rail. The first input rail, the second input rail, the first output rail, the second output rail, the third output rail, and the fourth output rail are all bidirectional.

BRIEF DESCRIPTION OF THE DRAWINGS

Accompanying drawings show exemplary block and circuit diagrams. However, the accompanying drawings should not be taken to limit the embodiments shown, but are for explanation and understanding only.

FIGS. 5-1 and 5-2 in combination is a block/circuit diagram depicting yet another exemplary STFB.

DETAILED DESCRIPTION

Figure 1:
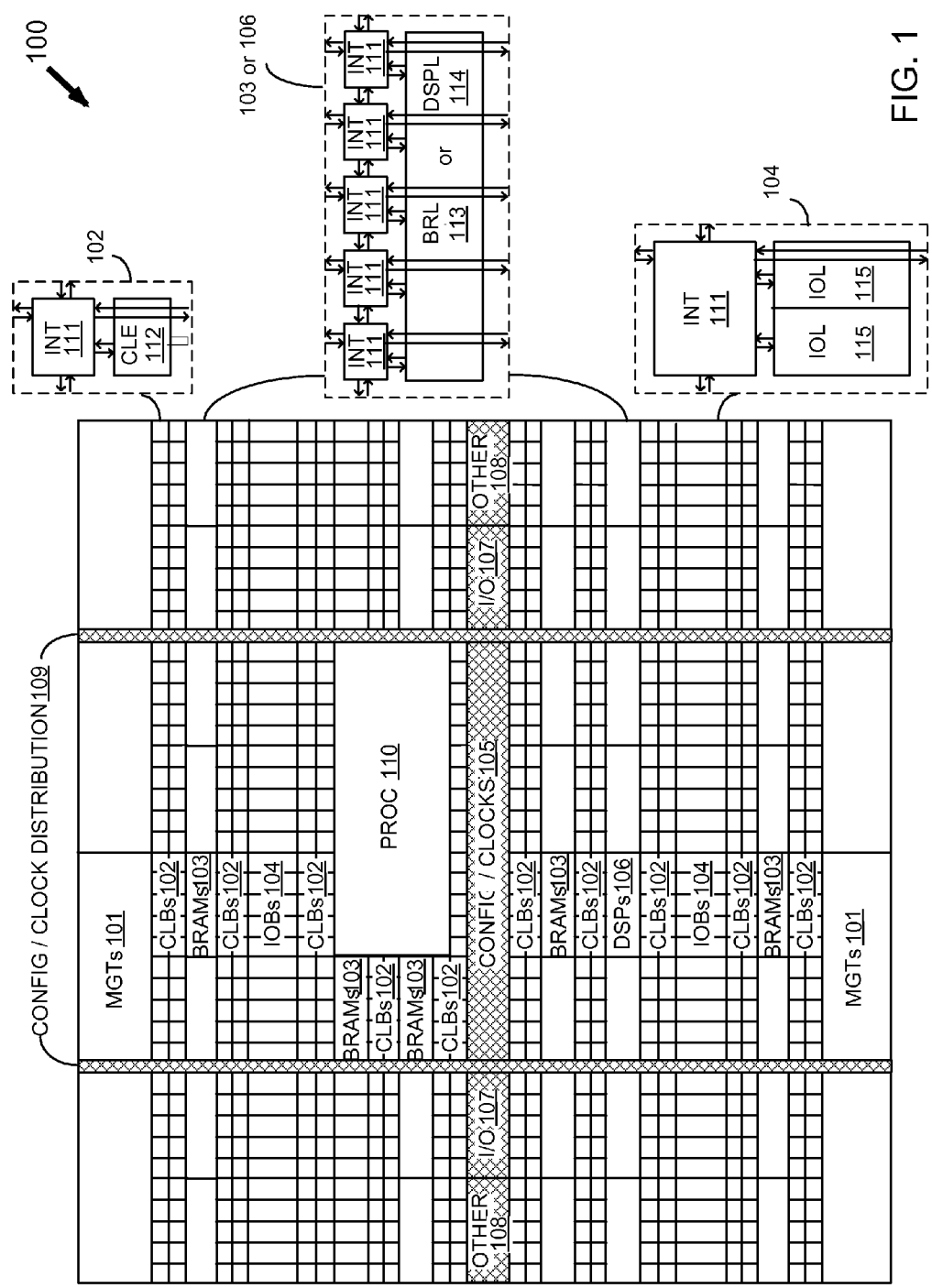
FIG. 1 is a simplified block diagram depicting an exemplary columnar Field Programmable Gate Array ("FPGA") architecture.

In the following description, numerous specific details are set forth to provide a more thorough description of the specific embodiments. It should be apparent, however, to one skilled in the art, that one or more embodiments may be practiced without all the specific details given below. In other instances, well known features have not been described in detail so as not to obscure the one or more embodiments. For ease of illustration, the same number labels are used in different diagrams to refer to the same items; however, in alternative embodiments the items may be different.

Before describing the exemplary circuits illustratively depicted in the several figures, a general introduction is provided to further understanding.

Conventionally, single track circuits have been employed where input and output loads are small and uniform. However, in an FPGA routing environment, interconnect multiplexers may drive signals significant distances, including without limitation routes that cross multiple tiles, and may be exposed to significant loads, including without limitation due to fanout to multiple destinations. Accordingly, conventional single track circuits generally are not suitable for use in an FPGA routing environment.

With the above general understanding borne in mind, various exemplary self-timed single track circuits are generally described below. Such a self-timed single track circuit uses separate pulse generator portions, and senses the state in an output stage in order to know when to shut off a pulse generator portion associated with an input stage for such self-timed operation. This approach may allow for more robust performance with large capacitive loads. This approach may further allow for the independent sizing of forward going and acknowledgment circuitry.

Because one or more of the described circuits are exemplified using a particular type of IC, a detailed description of such an IC is provided below. However, it should be understood that other types of ICs may benefit from one or more of the embodiments described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Figure 2:
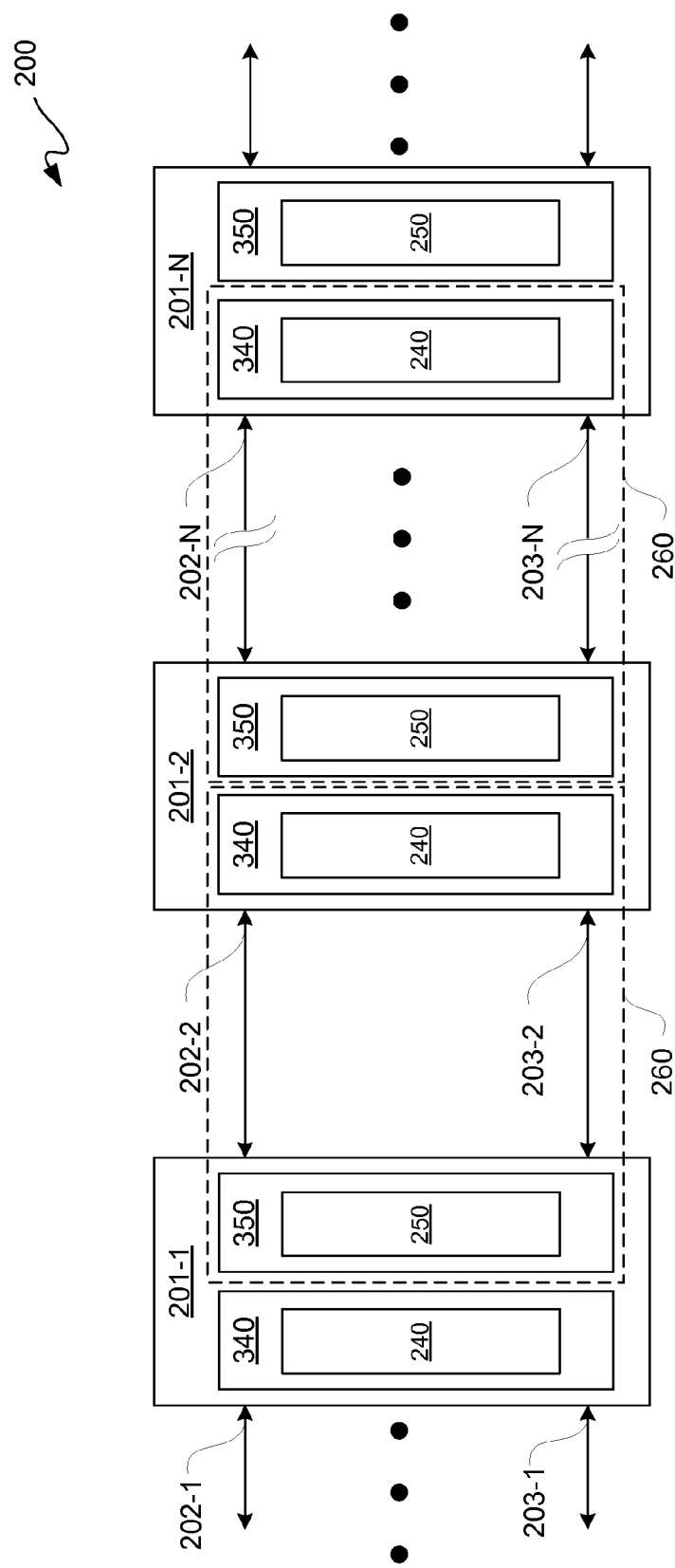
FIG. 2 is a block diagram depicting an exemplary series of buffers.

FIG. 2 is a block diagram depicting an exemplary series of buffers 200. Buffers 200 include single-track full-buffers ("STFBs") 201-1 through 201-N, for N a positive integer larger than one, ("STFBs 201"). STFB 201-1 may be coupled to STFB 201-2 by two interconnects or rails, such as for example rails 202-2 and 203-2, and STFB 201-2 may be coupled to a subsequent STBF, such as STFB 201-N for example, using two rails, such as for example rails 202-N and 203-N. Having two rails for communication to and from an STBF 201 for propagation of data and handshaking may be referred to a two rail configuration. Each of STFBs 201 is a self-timed circuit.

Bidirectional inputs 202-1 and 203-1 of an STFB 201-1 may be used to receive data to STFB 201-1 and provide control information of STFB 201-1. Bidirectional outputs 202-2 and 203-2 of STFB 201-1 may be used to provide data to STFB 201-2 and to obtain control information from and provide control information to STFB 201-2.

Even though STFBs 201 are described below in terms of an FPGA interconnect, it should be understood that STFBs 201 may be used more generally as multiplexers, buffers, inverters, or other types of circuits, and such STFBs 201 are not limited to an FPGA IC, but may be used in any of a variety of ICs in accordance with the description herein. Furthermore, even though an STFB 201 is illustratively depicted as driving another STFB 201, in other embodiments an STFB 201 may drive a conventional single-track buffer, or a conventional single-track buffer may drive an STFB 201.

Each STFB 201 includes an input stage 340 and an output stage 350. Each input stage 340 includes an input driver 240, and each output stage 350 includes an output driver 250. An output stage 350 of an upstream STFB 201-1 in combination with an input stage 340 of an adjacent downstream STFB 201-2, where such output stage 350 and input stage 340 are coupled to one another via bidirectional inputs 202-2 and 203-2, provides a pulse generator 260. Likewise, another pulse generator 260 may be provided by the combination of output stage 350 of STFB 201-2 and input stage 340 of STFB 201-N, for N equal to 3 for example. These two pulse generators 260 are independent of one another with respect to capacitive loading on associated rails. Thus, for example a signal pulse width provided by an upstream pulse generator 260 does not affect a signal pulse width provided by a downstream pulse generator 260.

Figure 3:
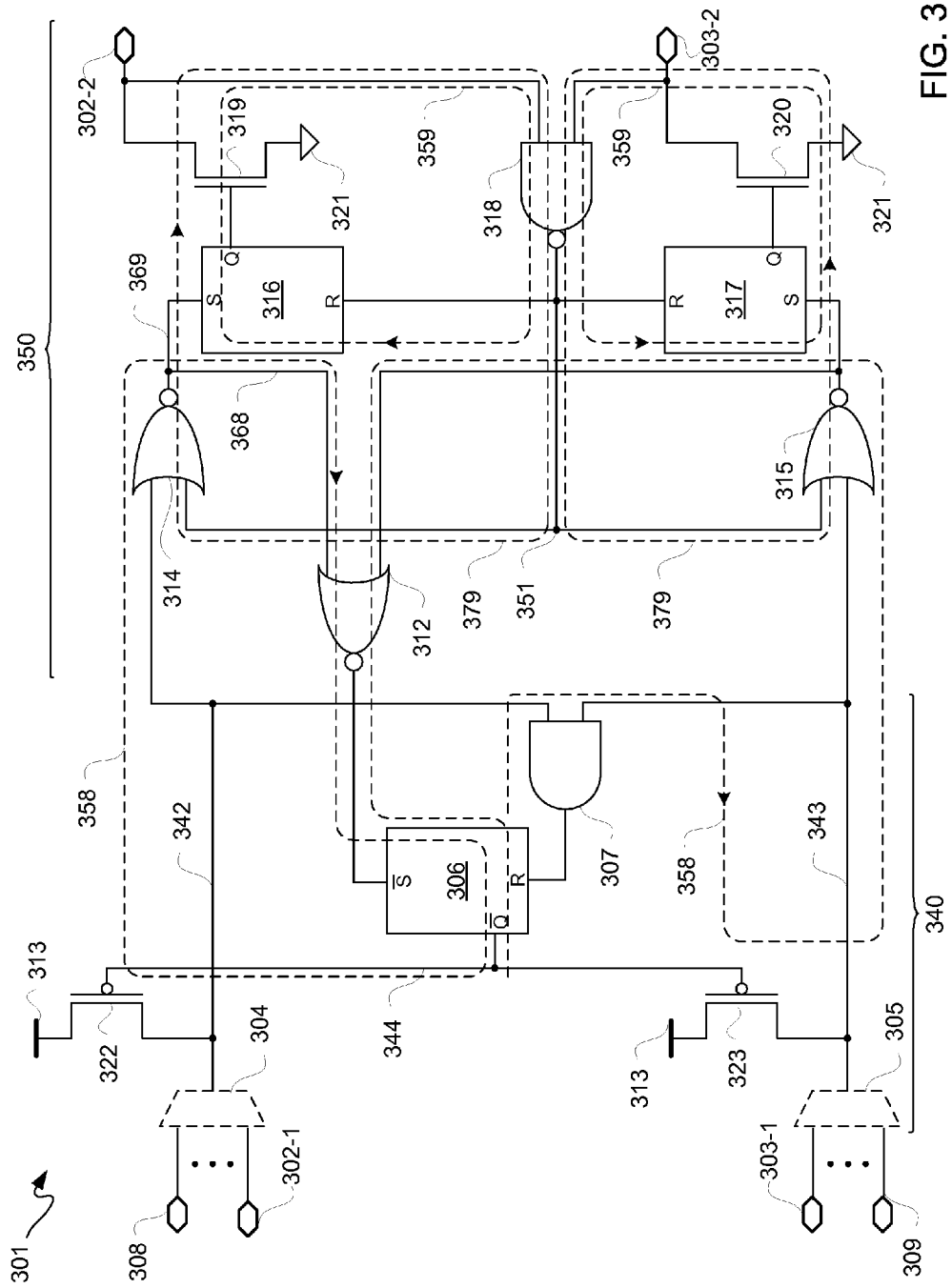
FIG. 3 is a block/circuit diagram depicting an exemplary single-track full buffer ("STFB").

FIG. 3 is a block/circuit diagram depicting an exemplary STFB 301. STFB 301 may be an STFB 201 of FIG. 2. STFB 301 is a dual-rail single track type of buffer. STFB 301 includes an input stage 340 and an output stage 350. Input stage 340 of one STFB 301 in combination with output stage 350 of a previous STFB 301 coupled to such input stage 340 provides a pulse generator, as described below in additional detail. However, as shall be more appreciated from the following description, apart from passing an input signal from input stage 340 to output stage 350 and feeding back a control signal from output stage 350 to input stage 340, pulse generation by an input stage 340 is independent of separate pulse generation by an output stage 350 of a same STFB 301. Along those lines, an input pulse width of a pulse generator associated with an input stage 340 of an STFB 301 is independent or decoupled from an output pulse width of a pulse generator associated with an output stage 350 of such same STFB 301.

This decoupling is illustratively depicted by loops 358 and 359 being independent from one another with respect to timing. There are upper and lower loops 358 and 359 as associated with a true side and a false side, respectively. For purposes of clarity and not limitation, generally only the upper loop 358 is described, as description of both the upper and lower loops 358 and 359 would be repetitive.

Once output from NOR gate 314 is provided along a feedback path of loop 358 and into a set port of SR latch 316 of loop 359, timing of going through such loops is decoupled from one another. More particularly, timing associated with turning on and off an output driver, such as NMOS transistors 319 and 320 for example, is determined by loop 359 and not determined by loop 358. Thus, a feedback signal output from NAND gate 318 of output stage 350 may be used for self-timed operation of output stage 350 independent from input stage 340. In other words, capacitive loading on output stage 350 is decoupled from capacitive loading on input stage 340 of STFB 301. Therefore, for example, a short pulse width of an input pulse on an input stage for example is not necessarily going to be too short for an output stage due to a high capacitive loading on such output stage.

Furthermore, outputs of NOR gates 314 and 315 are each forked. For example, a branch 368 of the output of NOR gate 314 is provided as feedback for feedback loop 358, and a branch 369 of the output of NOR gate 314 and a common branch 351 of the output of NAND gate 318 is provided as feed forward input of a feedback loop 379. Feedback loop 359 may be within feedback loop 379. The faster input to have an effect on output of NOR gate 314, namely from feedback branch 368 of feedback loop 358 or feed forward branch 369 of feedback loop 379, is used to deassert a set input of SR latch 316. This is useful to avoid a condition due to significantly delay deassertion of a set input of an output SR latch 316 due to heavy capacitive loading on output driver transistor 319. In other words, by having either loop path 358 or 379 deassert a set input on SR latch 316, next data is prevented from arriving while an output channel of an output stage 350 is still full due to such capacitive loading. Lower loops and branches are not described to avoid repetition, but likewise may be used to deassert a set input on SR latch 317.

Input rail 302-1 and input rail 303-1 may be predetermined as being either a "true" side or a "false" side. A "true" side may be referred to a logic high data side, and a "false" side may be referred to a logic low data side; however, this does not mean that the actual data on such sides is either only logic high or logic low. Rather, it means if a signal is asserted on a logic high side, such signal represents a logic high even if such signal itself is not a logic high. Furthermore, such two rails 302-1 and 303-1 may be used to communicate both state and readiness of data and an acknowledgement that data was received, as described below in additional detail. For purposes of clarity and not limitation it shall be assumed that input rail 302-1 is a true side rail, and that input rail 303-1 is a false side rail. Likewise, it shall be assumed that output rail 302-2 and output rail 303-2 respectively are a true side and a false side.

STFB 301 may be used as an FPGA interconnect or other interconnect. However, STFB 301 may be used for multiplexing, buffering, driving, and/or interconnecting, among other circuit functions, and may be used in ICs other than FPGAs. Thus, any IC with asynchronous channels for self-timed operation may employ STFB 301.

Multiple input wires 308 and multiple input wires 309 may respectively be provided to optional multiplexers 304 and 305. Configuration memory cells (not shown here) may be coupled to optional multiplexers 304 and 305 to provide control select signals thereto. For purposes of clarity and not limitation, it shall be assumed that fanin input wires 308 and 309 are not used, and that input rails 302-1 and 303-1, as well as optional multiplexers 304 and 305 are used.

If outputs of multiplexers 304 and 305 are both at logic high states, then no data is present on an input interface to input stage 340. If one output of multiplexers 304 and 305 is logic low, and the other output of multiplexers 304 and 305 is logic high, then data is present on the input interface to input stage 340. Assuming an active low operation, then continuing the above example that input rail 302-1 is the true side, if output of multiplexer 304 is logic low, then the data state is logic high. Likewise, if output of multiplexer 305 is logic low, then the data state is logic low. Outputs of both of multiplexers 304 and 305 may be prevented from both transitioning to low at the same time on rails 342 and 343. Rather, instructions or protocol may be used to prevent both of rails 342 and 343 from being logic low at the same time. Furthermore, an STFB 301 itself, if surrounded by other STFBs 301, is guaranteed not to have both rails low simultaneously by STFB 301 itself. So instructions and protocol may be enforced on the boundaries of the set of STFBs 301 to prevent both rails 342 and 343 from going low at the same time, but logic within STFB 301 itself is such that assuming boundary conditions are met, both rails 342 and 343 cannot go low at the same time.

Input stage 340 effectively is a portion of a pulse generator, as described below in additional detail. Input stage 340 includes voltage pull-up PMOS transistors 322 and 323, AND gate 307, and SR latch 306. Input stage 340 may optionally include multiplexers 304 and 305. SR latch 306 may be a reset-dominant SR latch.

Output of multiplexer 304 is provided via node 342 as an input to NOR gate 314 and to AND gate 307. Output of multiplexer 304 is coupled to a drain node of PMOS transistor

322. A source node of PMOS transistor 322 is coupled to a supply voltage 313, such as Vdd for example.

Output of multiplexer 305 is provided via node 343 as an input to NOR gate 315 and to AND gate 307. Output of multiplexer 305 is coupled to a drain node of PMOS transistor 323. A source node of PMOS transistor 323 is coupled to a supply voltage 313, such as Vdd for example.

Output of AND gate 307 is provided to a reset input port ("R") of SR latch 306. A complemented output ("Q bar") of SR latch 306 provided to gates of PMOS transistors 322 and 323 via node 344. Output NOR gate 312 is provided to a complemented set input port ("S bar") of SR latch 306.

Output stage 350 effectively provides a portion of a pulse generator and provides a feedback controller, as described below in additional detail. Output stage 350 includes NOR gates 312, 314 and 315, SR latches 316 and 317, NMOS pull-down transistors 319 and 320, and NAND gate 318. SR latches 316 and 317 may be reset-dominant SR latches.

NAND gate 318, NOR gate 312, and NOR gates 314 and 315 are part of a feedback path 358 from output stage 350 to SR latch 306 of input stage 340. Feedback associated with state of output stage 350 is provided to input stage 340 to decouple pulse widths associated with input stage 340 and output stage 350.

Output of NOR gate 314 is provided as an input to a set ("S") input port of SR latch 316 and to an input of NOR gate 312. An output ("Q") of SR latch 316 is provided to a gate of NMOS transistor 319. A source node of NMOS transistor 319 is coupled to a ground 321, and a drain node of NMOS transistor 320 is coupled to output rail 302-2 and to an input of NAND gate 318.

Output of NOR gate 315 is provided as an input to a set ("S") input port of SR latch 317 and to another input of NOR gate 312. An output ("Q") of SR latch 317 is provided to a gate of NMOS transistor 320. A source node of NMOS transistor 320 is coupled to ground 321, and a drain node of NMOS transistor 320 is coupled to output rail 303-2 and to another input of NAND gate 318.

Output of NAND gate 318 is provided to reset input ports of SR latches 316 and 317, as well as other inputs of NOR gates 314 and 315, via node 351. Again, output of NOR gate 312 is provided to a complemented or inverted set port of SR latch 306.

For purposes of clarity and not limitation, it shall be assumed that no data is present on the output interface of output stage 350. Therefore, it shall be assumed that both of output rails 302-2 and 303-2 are logic high. Further, for purposes of clarity by way of example not limitation, it shall be assumed that output of multiplexer 304 is a logic low and that output of multiplexer 305 is logic high. In other words, continuing the above example, it shall be assumed that a data state representing a logic high is at the input interface of input stage 340.

For output rails 302-2 and 303-2 both being a logic high, such as having voltages on such rails being pulled up by corresponding PMOS pull-up transistors to transistors 322 and 323 of a subsequent input stage 340, output of NAND gate 318 is logic low. Thus, output of NOR gate 314 is logic high, and output of NOR gate 315 is logic low.

Output of NOR gate 312 is a logic low responsive to a logic high output from either of outputs of NOR gates 314 and 315. Thus, a logic high output from NOR gate 314 causes output of NOR gate to be logic low. A logic low on either of rails 342 or 343 causes output of AND gate 307 to be logic low. A logic low output from NOR gate 312 for input to a S bar port of SR latch 306 and a logic low output from AND gate 307 for input to an R port of SR latch 306 means that output from a Q bar port of SR latch is a logic low. Effectively, this means that a feedback shut off signal from output stage 350 is received by NOR gates 314 and 315 to cause outputs of either of those gates to cause a logic low to be output from SR latch 306.

With both S bar and R inputs to SR latch 306 being logic low, complement output of SR latch 306 outputs a logic low. For a logic low output from a complemented output port of SR latch 306 to gates of PMOS transistors 322 and 323, then those transistors electrically couple supply voltage 313 to rails or nodes 342 and 343, respectively. By pulling up a voltage on a rail 342 from a logic low to a logic high, effectively and end of an inverse pulse is provided by such transition. The beginning of such pulse may be generated by initiating a logic low on rail 342, which may be caused by coupling rail 342 to a ground 321, such as by an output driver 319 of a previous output stage 350.

Generally, once a data bit is detected on a rail, namely a change in state on an input wire, such data value is latched, and almost simultaneous with latching of such data value, both input wires are reset to be ready for a next data bit. Resetting of such input wires, such as pulling up voltage on rails 342 and 343 to logic high, may be used to communicate to a previous stage, such as a previous output stage 350 for example, an acknowledgment of receipt of data and a state of readiness for sending the next data bit. However, input stage 340 is not actually ready to receive a next bit of data at this time, because both PMOS transistors 322 and 323 would be on and driving a rail of rails 342 and 343 low would consume a significant amount of power. Input stage 340 will actually be ready to receive a next data bit when both PMOS transistors 322 and 323 are off; however, an indication of readiness may be sent prior to such PMOS transistors 322 and 323 being off, as such PMOS transistors 322 and 323 will shortly be shut off, as described below in additional detail with reference to feedback from output stage 350. In other words, there is a race condition to turn off PMOS transistors 322 and 323 to electrically decouple rails 342 and 343 from Vdd 313 before such one of such rails is coupled to ground 321 by an output driver transistor 319 or 320, respectively, of an immediately adjacent upstream output stage 350.

Continuing the above example, outputs of NOR gates 314 and 315 are respectively logic high and logic low. For a logic high provided to a set input port of SR latch 316, a non-complimented or true output ("Q") of SR latch 316 is logic high. Such a logic high output from SR latch 316 which is provided to a gate of NMOS transistor 319, causes NMOS transistor 319 to electrically couple output node or rail 302-2 to ground. In other words, the data received by input stage 340 has been received, buffered, and now passed downstream as an output by output stage 350.

For a logic low provided to a set input port of SR latch 317, a non-complimented output of SR latch 317 is logic low. Such a logic low output from SR latch 317 gating NMOS transistor 320 maintains NMOS transistor 320 in a substantially non-conductive or off state. Thus, output node or rail 303-2 is still electrically decoupled from ground.

By electrically coupling output rail 302-2 to ground 321, an inverse pulse is initiated by output stage for passing data to a downstream input stage 340. In other words, an output driver of output drivers, such as NMOS transistors 319 and 320 in this example, of an output stage 350 may be used to start generation of a pulse, namely cause output stage 350 to start generating a pulse for output. Furthermore, by feedback through gates coupled to output rails, such an output of such output drivers may be used to cause an input stage 340 end a pulse.

A logic low from output rail 302-2 and input to NAND gate 318 causes NAND gate 318 to output a logic high or one. A logic high or one from NAND gate 318 cause one of SR latches 316 and 317 to reset, namely output a logic low or zero from its non-complemented output port, and the other of such SR latches 316 and 317 maintains its state even through reset is asserted. These logic lows output from SR latches 316 and 317 turn off one of NMOS transistors 319 and 320 to decouple a rail of rails 302-2 and 303-2, respectively, from ground 321. This allows a subsequent input stage or input driver stage to pull-up voltage on such rail, for reasons as previously described.

It should be understood that input drivers, such PMOS transistors 322 and 323, of a downstream input stage may be used to pull voltage on output rails 302-2 and 303-2 to logic highs or ones. This causes NAND gate 318 to output a logic zero or low, as previously described. However, when one of output rails 302-2 and 303-2 is pulled to a logic low, output from NAND gate 318 is a logic high. An output of a logic high from NAND gate 318 causes outputs from NOR gates 314 and 315 to both be logic lows. Logic lows output from NOR gates 314 and 315 cause output of NOR gate 312 to be a logic high, and a logic high input to a complemented set input port of SR latch 306 does not cause any change in state of output from such SR latch 306. Logic lows respectively input to set input ports of SR latches 316 and 317 do not cause any change in states of outputs of those latches.

As previously described, pulling up voltage on input rails 342 and 343 may be performed after output driver transistors 319 and 320 are both electrically decoupled from ground 321. Logic high voltage on input rails 342 and 343 is an acknowledgement of receipt of data and an indication of readiness to receive new data. However, once both of input rails 342 and 343 are logic high, output of AND gate 307 transitions to logic high. A logic high output from AND gate 307 causes SR latch to reset, namely output a logic high from its complimented output port. This causes both PMOS transistors 322 and 323 to turn off to decouple rails 342 and 343 from Vdd 313 to be ready for the next data bit. In other words, by turning off PMOS transistors 322 and 323, STFB 301 can avoid drawing contention current with an upstream device. Furthermore, there is a very brief time between acknowledgement and decoupling of input rails 342 and 343 from Vdd 313, so as to avoid any possibility of drawing such contention current. In other words, there is a race condition that comes out correctly between an upstream transmitter and a downstream receiver.

By having the output of a one of NOR gates 314 and 315 control assertion of a "set" input of one of SR latches 316 and 317, as previously described, a functional failure may be prevented. For example, a functional failure could result if deassertion of one set input of such SR latches 316 and 317 was delayed too much due a heavily loaded output associated therewith. This may be due to an imbalance in capacitive or other loading on output rails for example. By having either one of NOR gates 314 or 315 output control, a next bit of data is prevented from arriving while the output channel is still full. Accordingly, as described above, each output stage pulse generation is individually reset by sensing voltage on output rails, and each input stage pulse generation is individually reset by sensing voltage on input rails.

Additionally, STFB 301 has built-in delays that reduce the likelihood of overlapping pulses, namely when one output stage sends data and a receiving input stage immediately acknowledges, or vice versa. As indicated above, such overlapping pulses may result in lower or no short circuit current. However, as described above, turning off either a data forwarding pulse or a data acknowledging pulse involves traveling through fewer logic stages than shutting off a stage. This time difference provided by gate delays provides timing margin to reduce the likelihood of overlapping pulses. In addition to gate delays, there may be wire delays due to parasitic capacitance.

As pulse generation of an input stage 340 may be independent from pulse generation of output stage 350, a designer has freedom to change drive strength of PMOS and NMOS drivers, such as PMOS transistors 322 and 323 and NMOS transistors 319 and 320 for example. For example, NMOS transistors 319 and 320 may be substantially larger than PMOS transistors 322 and 323.

STFB 301 of FIG. 3 is for a single active fanout. In STFB 301, circuitry of each of multiplexers 304 and 305 may be self-contained such that all fanout loads need not be located close together.

Figure 4:
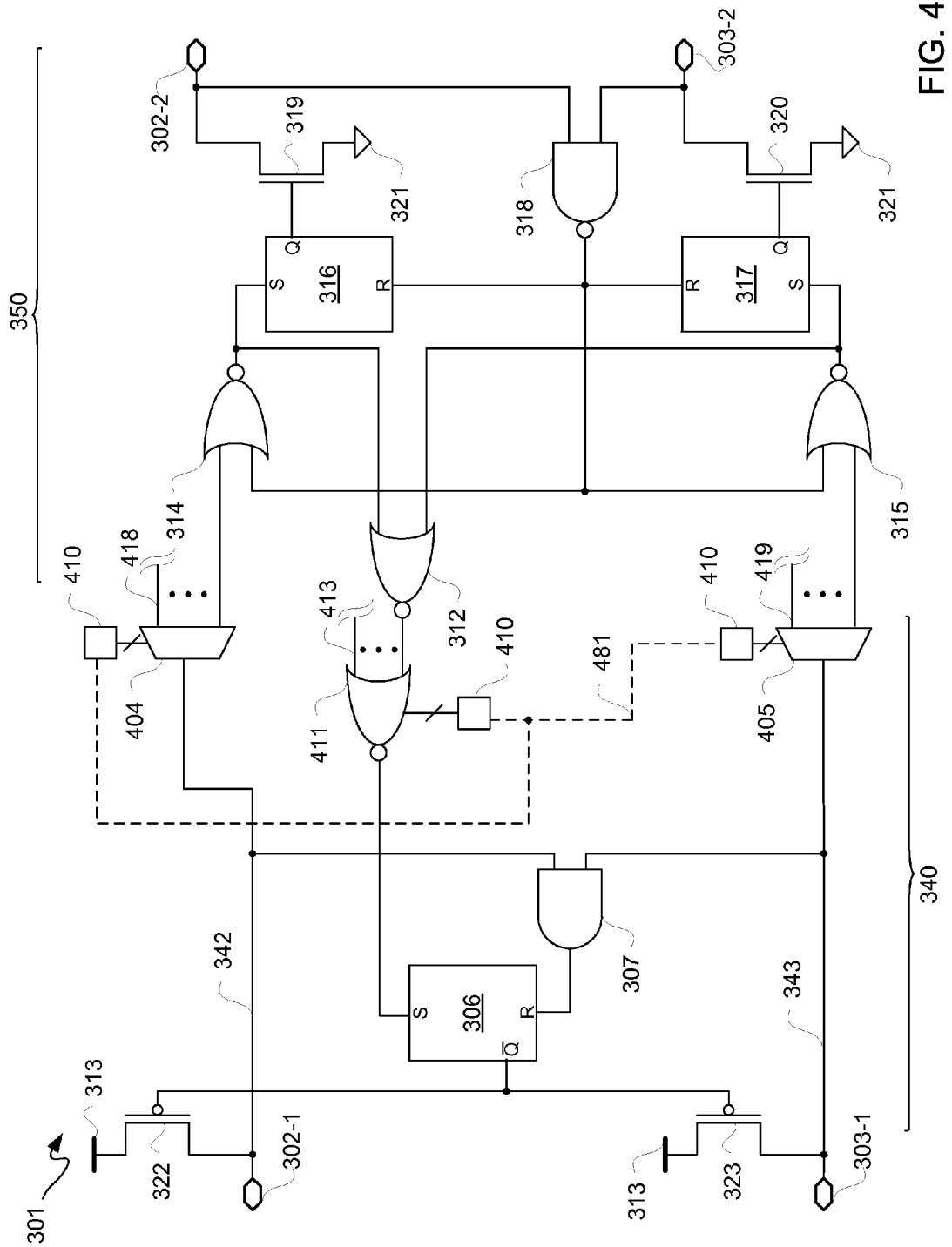
FIG. 4 is a block/circuit diagram depicting another exemplary STFB.

FIG. 4 is a block/circuit diagram depicting another exemplary STFB 301. Input stage 340 includes voltage pull-up PMOS transistors 322 and 323, AND gate 307, SR latch 306, demultiplexers 404 and 405, programmable NOR gate 411, and configuration memory cells 410. Output stage 350, as before, includes NOR gates 312, 314 and 315, SR latches 316 and 317, NMOS pull-down transistors 319 and 320, and NAND gate 318. As STFBs 301 of FIGS. 3 and 4 are similar in many respects, generally only the differences are described below to avoid repetition for purposes of clarity.

Demultiplexers 404 and 405 each have m bidirectional outputs 418 and 419, respectively, driven by bidirectional inputs 302-1 and 303-1, respectively. This is because for an FPGA, a circuit design is not necessarily known in advance of creating the FPGA. Thus, there may be multiple output stages 350, or other loads, coupled to demultiplexers 404 and 405, and a user may determine which one or more outputs of demultiplexers 404 and 405 is/are to be active by programming configuration memory cells 410. Configuration memory cells 410 may be coupled to demultiplexers 404 and 405, as well as multiple input programmable NOR gate 411, to provide control select signals respectively thereto. Optionally, a same set of configuration memory cells 410 may be used to program both NOR gate 411 and demultiplexers 404 and 405 as generally indicated by dashed line 481. In this example, inputs to demultiplexers 304 and 305 are tied to drain nodes, namely located after, PMOS transistors 322 and 323. An output of demultiplexer 404 is provided as an input to NOR gate 314, and an output of demultiplexer 405 is provided as an input to NOR gate 315. There may be other output stages 350, as generally indicated by fanout paths 418 and 419. For example, there may be n fanout paths 418 and 419 driven by outputs of demultiplexers 404 and 405, respectively. Again, because this is for an FPGA interconnect, any of a variety of circuit interconnect configurations may be provided. Thus, fanout paths 418 and 419 may be to other NOR gates 314 and 315, respectively, of other output stages 350.

Likewise, there may be n outputs 413 corresponding to an output of NOR gates 312 for such other output stages 350. Outputs of such other NOR gates 312 may be provided as inputs to programmable NOR gate 411, along with output from NOR gate 312. Once all active outputs of NOR gates 312 have cleared, namely are logic low in this example, output of NOR gate 411 may transition from a logic low to a logic high to set SR latch 306. In this example, output of NOR gate 411 is provided to a non-complemented set port of SR latch 306. Along those lines, when set is a logic one, output on Q bar of SR latch 306 is a logic low. This turns on PMOS transistors 322 and 323, as previously described.

Once one or more fanout destinations feedback signals indicate that data has been latched and output from all active associated output stages 350, as previously described, output of NOR gate 411 may set SR latch 306. Again, which outputs of NOR gates 312 are used may be determined by programming configuration memory cells 410 to select which inputs of NOR gate 411 are used.

STFB 301 of FIG. 4 allows for multiple active fanouts. A single input stage 340 may be used to drive multiple channels to which data could fanout, namely to drive multiple output stages 350. Using a programmable NOR gate 411 in an acknowledge or feedback path, loads associated with multiple output stages 350 that are active may be used to control acknowledgement provided to a single input stage 340. Furthermore, the same configuration memory cells 410 used to control pass gate multiplexers of a programmable interconnect may control programmable NOR gate 411, as described in additional detail in a co-pending and commonly assigned patent application entitled "Programmable Interconnect Network," by Brian C. Gaide and Steve Young, filed concurrently herewith, which is incorporated by reference herein in its entirety for all purposes.

Figures 1, 5:
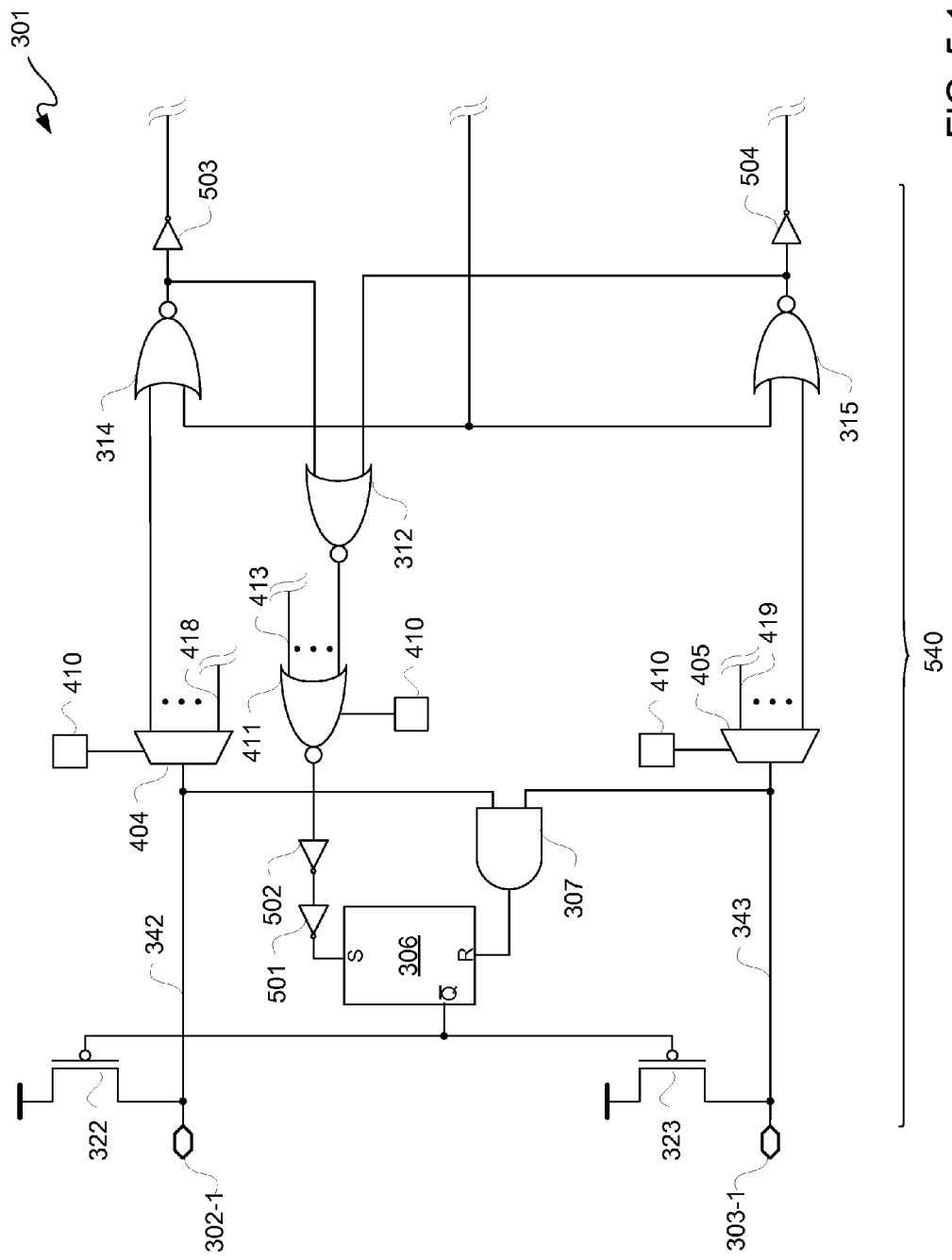
Figures 2, 5:
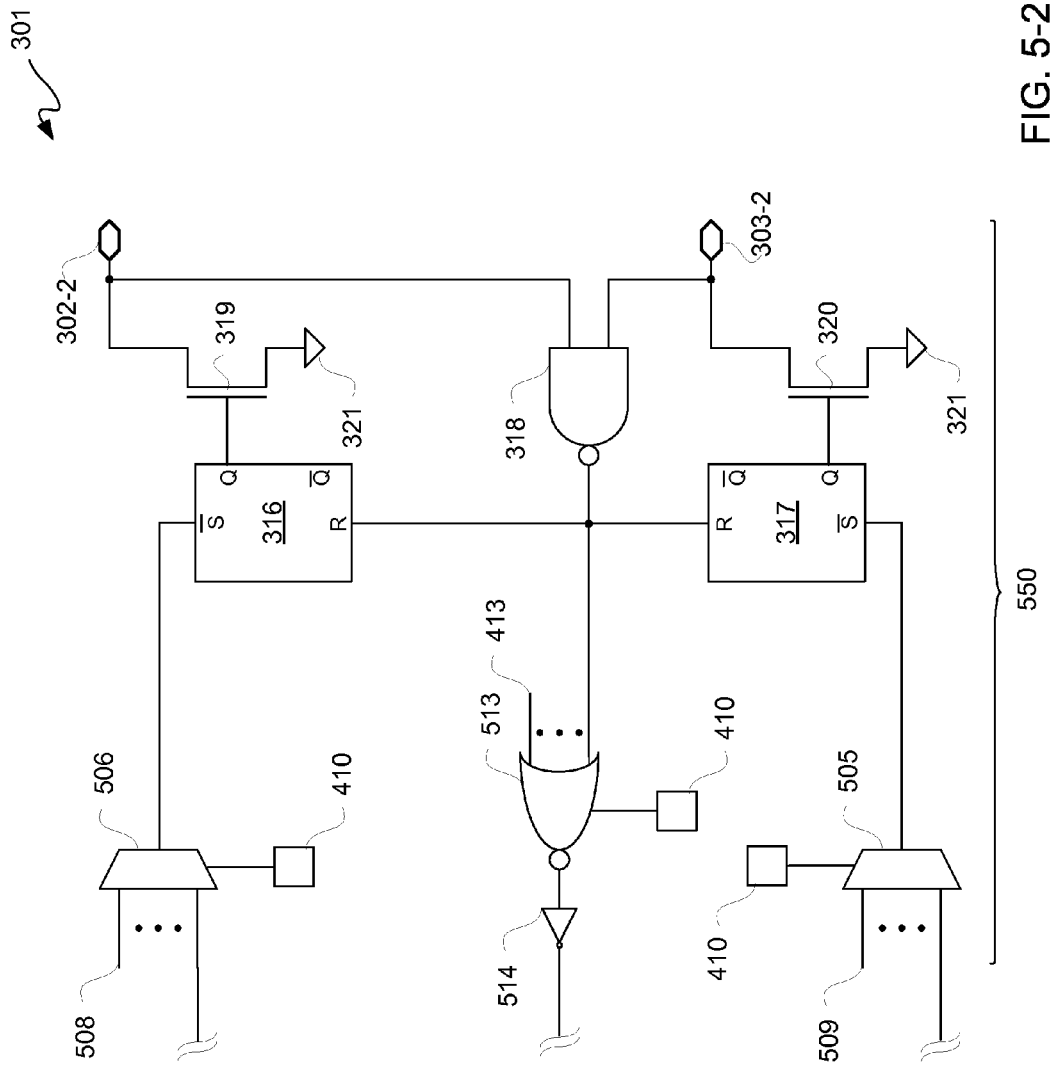

FIGS. 5-1 and 5-2 ("FIG. 5") in combination is a block/circuit diagram depicting yet another exemplary STFB 301. STFB 301 of FIG. 5 has two multiplexer stages 540 and 550 instead of one multiplexer stage as in STFBs 301 of FIGS. 3 and 4. Thus, cost per multiplexer may be reduced at the expense of slower cycle time and less data storage.

Multiplexer stage 540 includes voltage pull-up PMOS transistors 322 and 323, AND gate 307, SR latch 306, demultiplexers 404 and 405, programmable NOR gate 411, configuration memory cells 410, inverters 501 through 504, and NOR gates 312, 314 and 315. Multiplexer stage 550 includes programmable NOR gate 513, SR latches 316 and 317, NMOS pull-down transistors 319 and 320, inverter 514, NAND gate 318, configuration memory cells 410, and multiplexers 505 and 506. As STFBs 301 of FIGS. 4 and 5 are similar in many respects, generally only the differences are described below to avoid repetition for purposes of clarity.

Input rails 342 and 343 may be respectively coupled to inputs of demultiplexers 404 and 405. An output of demultiplexer 404 may be provided as an input to NOR gate 314. Outputs 418 of demultiplexer 404 may be provided as fanout to other NOR gate 314 inputs of other output stages 350 or multiplexer stages 550. Configuration memory cells 410 may be programmed for a user select which outputs of demultiplexer 404 to use. Likewise, an output of demultiplexer 405 may be provided as an input to NOR gate 315. Outputs 419 of demultiplexer 405 may be provided as fanout to other NOR gate 315 inputs of other output stages 350 or multiplexer stages 550. Configuration memory cells 410 may be programmed for a user select which outputs of demultiplexer 405 to use.

An inverter 503 may be coupled to receive an output from NOR gate 314, and an inverter 504 may be coupled to receive an output from NOR gate 315. Output of inverter 503 is provided as an input to multiplexer 506, and output of inverter 504 is provided as an input to multiplexer 505. Other inputs 508 may be provided from other inverters 503 of other multiplexer stages 540, and other inputs 509 may be provided from other inverters 504 of other multiplexer stages 540.

Configuration memory cells 410 may be programmed by a user's configuration bitstream to select which inputs 508 and 509 to use for output respectively from multiplexers 506 and 505. Output from multiplexer 506 may be provided as an input to a complemented set port of SR latch 316, and output from multiplexer 505 may be provided as an input to a complemented set port of SR latch 317.

Output of NAND gate 318 may be provided as an input to programmable NOR gate 513. Other inputs 413 to NOR gate 411 may be provided from other desitinations, namely from other NAND gates 318 of other multiplexer stages 550. Configuration memory cells 410 may be programmed by a configuration bitstream to select which of inputs 413 to use for output of NOR gate 513. Output of NOR gate 514 may be provided as an input to inverter 514, and output of inverter 514 may be provided as respective inputs to NOR gates 314 and 315. Again, outputs of NOR gates 314 and 315 may be provided as inputs to NOR gate 312.

Output of NOR gate 312 may be provided as an input to programmable NOR gate 411. Other inputs 413 to programmable NOR gate 411 may be provided from other desitinations, namely from other fanout destinations, and such other inputs 413 may be from other NOR gate 312 outputs. Selection of which inputs 413 to use for programmable NOR gate 411 may be controlled by programming configuration memory cells 410. Output of NOR gate 411 is provided to inverter 502, and output of inverter 502 is provided as an input to inverter 501. Output of inverter 501 is provided as an input to a set port of SR latch 306. Thus, in this example, a logic high output from programmable NOR gate 411 is likewise output from inverter 501, and such logic high would set SR latch 306 causing a Q bar output thereof to be a logic low.

Figure 6:
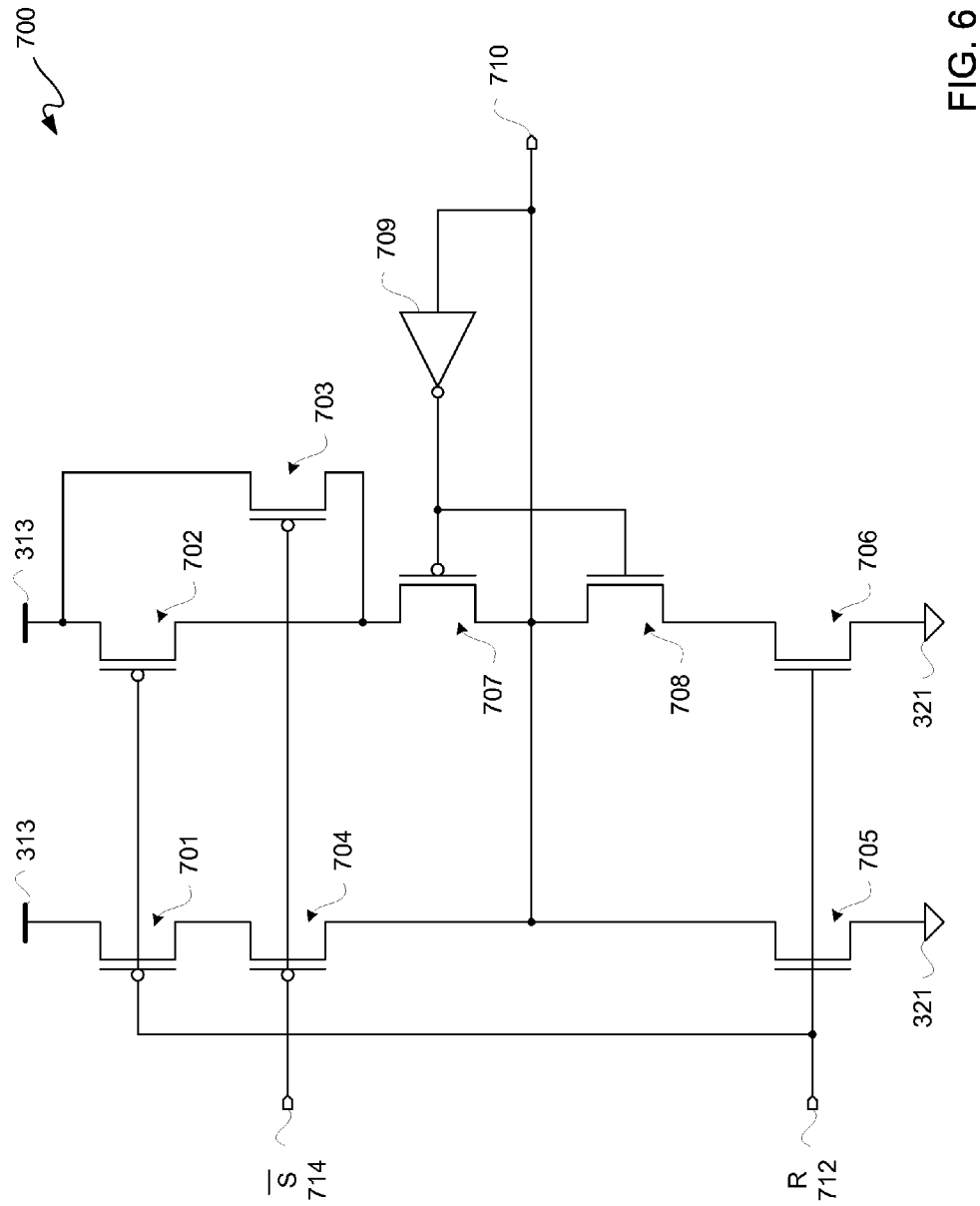
FIG. 6 is a circuit diagram depicting an exemplary reset-dominant set-reset ("SR") latch.

FIG. 6 is a circuit diagram depicting an exemplary reset-dominant SR latch 700. SR latch 700 may be the configuration of SR latches 306, 316, and 317. SR latch 700 is a reset-dominant latch, meaning that reset, when asserted, controls over any other inputs. SR latch 700 is implemented as a form of an "asymmetric C-element."

An output node 710 may be for a Q port of SR latch 700. A signal asserted on output node 710 is provided to an input of inverter 709 for feedback. Output of inverter 709 is provided to a gate of PMOS transistor 707 and a gate of NMOS transistor 708. A source/drain node of PMOS transistor 707 and a source/drain node of NMOS transistor 708 are commonly coupled to output node 710. Furthermore, a source/drain node of PMOS transistor 704 and a drain node of NMOS transistor 705 are commonly coupled to output node 710.

An input node 714 is common to gates of PMOS transistors 704 and 703. Input node 714 may be for an S bar port of SR latch 700. A source node of PMOS transistor 703 and a source node of PMOS transistor 702 are commonly coupled to Vdd 313. A drain node of PMOS transistor 703 is commonly coupled with a drain node of PMOS transistors 702 and the other source/drain node of PMOS transistor 707.

An input node 712 is commonly coupled to gates of NMOS transistors 705 and 706 and to gates of PMOS transistors 701 and 702. Input node 712 may be for an R port of SR latch 700. A source node of PMOS transistor 701 is coupled to Vdd 313. A drain node of PMOS transistor 701 is commonly coupled with the other source/drain node of PMOS transistor 704.

Source nodes of NMOS transistor 705 and 706 are coupled to ground 321. A drain node of NMOS transistor 706 is coupled to the other source/drain node of NMOS transistor 708. As previously described, a drain node of NMOS transistor 705 is coupled to output node 710.

Basically, in operation, if a set bar signal is logic low as provided to a set bar port of SR latch 700 while a reset signal is held logic low, then a non-complemented data output of SR latch 700 is logic high. Furthermore, if a reset signal is logic high as provided to SR latch 700, then a non-complemented data output of SR latch 700 is logic low. If a set bar signal is logic high and a reset signal is logic low as provided to SR latch 700, then there is no change in output state of SR latch 700. If a set bar signal is logic low and a reset signal is logic high as provided to SR latch 700, then such reset signal controls and a non-complemented data output of SR latch 700 is logic low.

Figure 7:
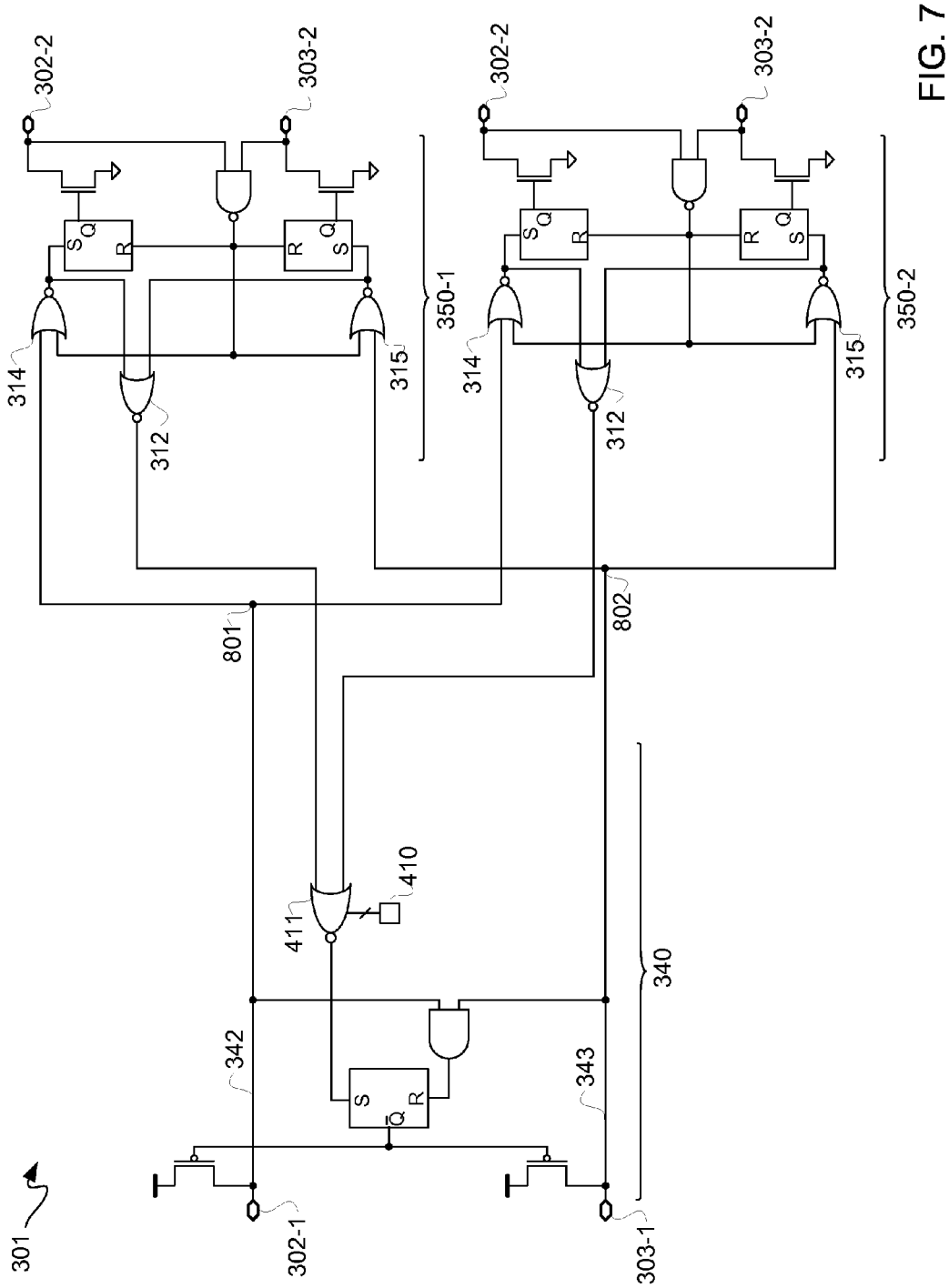
FIG. 7 is a block/circuit diagram depicting an exemplary STFB configured as a demultiplexer.

FIG. 7 is a block/circuit diagram depicting an exemplary STFB 301 configured as a demultiplexer. In this configuration, STFB 301 includes one input stage 340 and two output stages 350, namely output stage 350-1 and output stage 350-2. In other embodiments, more than two output stages 350 may be used. Rather than using demultiplexers, as previously described, input rails 342 and 343 are forked to provide multiple input rails. Thus, input rail 342 is forked at fork 801 to provide an input to a NOR gate 314 of each of output stage 350-1 and output stage 350-2. Likewise, input rail 343 is forked at fork 802 to provide an input to a NOR gate 315 of each of output stage 350-1 and output stage 350-2. Output of a NOR gate 312 of each of output stage 350-1 and output stage 350-2 is provided as a respective input to NOR gate 411 of input stage 340.

Figure 8:
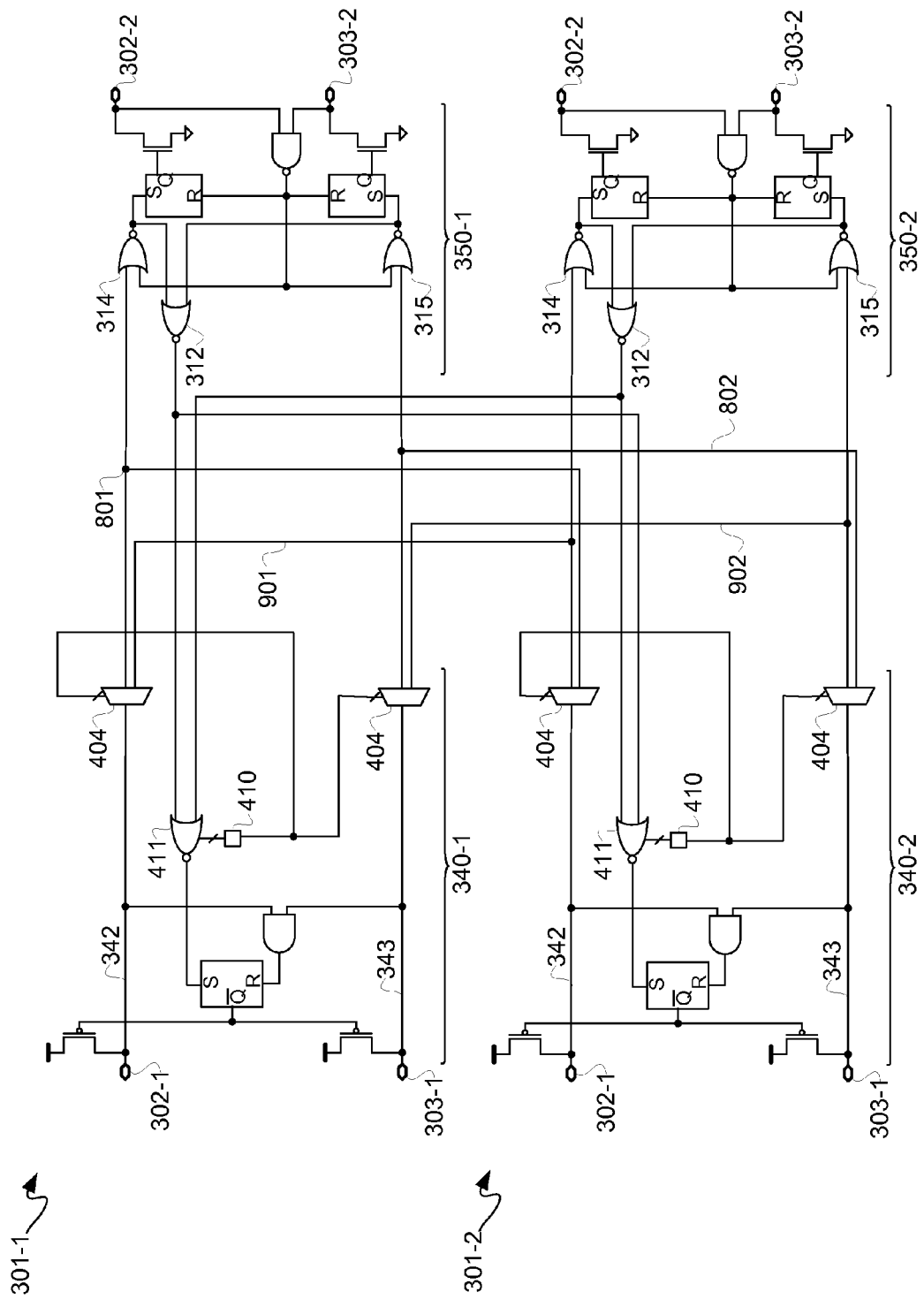
FIG. 8 is a block/circuit diagram depicting an exemplary two STFBs configured as cross-bar.

FIG. 8 is a block/circuit diagram depicting an exemplary two STFBs 301-1 and 301-2 configured as cross-bar. STBF 301-1 includes an input stage 340-1 and an output stage 350-1, and STBF 301-2 includes an input stage 340-2 and an output stage 350-2. Each STFB 301-1 and 301-2 includes a demultiplexer 404 coupled to an input rail 342 to receive input, and each STFB 301-1 and 301-2 includes a demultiplexer 404 coupled to an input rail 343 to receive input. Configuration memory cells 410 are coupled to such demultiplexers 404 to select which, if any, outputs are active.

For each STFB 301-1 and 301-2, a demultiplexer 404 on input rail 342 has one output coupled to an input of a NOR gate 314 of output stage 350-1 and another output coupled to an input of a NOR gate 314 of output stage 350-2. Furthermore, for each STFB 301-1 and 301-2, a demultiplexer 404 on input rail 343 has one output coupled to an input of a NOR gate 315 of output stage 350-1 and another output coupled to an input of a NOR gate 315 of output stage 350-2.

Thus, by programming configuration memory cells 410, a user can select whether data input to input stage 340-1 is passed to output stage 350-1 and/or 350-2. Likewise, by programming configuration memory cells 410, a user can select whether data input to input stage 340-2 is passed to output stage 350-1 and/or 350-2. A same or different set of configuration memory cells 410 may be used to program both programmable NOR gate 411 and demultiplexer 404. However, use of an output stage by an input stage is mutually exclusive with respect to use by another input stage. In other words, only one input stage may be used for an output stage; however, more than one output stage may be used by an input stage.

While the foregoing describes exemplary embodiments, other and further embodiments in accordance with the one or more aspects may be devised without departing from the scope thereof, which is determined by the claims that follow and equivalents thereof. Claims listing steps do not imply any order of the steps. Trademarks are the property of their respective owners.

What is claimed is:

1. An apparatus, comprising:
    a first output stage and a first input stage of a first single track buffer; a second output stage and a second input stage of a second single track buffer;
    wherein the second single track buffer is downstream from the first single track buffer; wherein the first output stage and the second input stage are coupled to one another via bidirectional rails;
    wherein a first pulse generator has a signal pulse width which is independent of a signal pulse width of a second pulse generator; and
    wherein the first output stage and the second input stage in combination provide the first pulse generator.
2. The apparatus according to claim 1, wherein the second pulse generator includes the second output stage.
3. The apparatus according to claim 1, wherein:
    the second output stage includes a feedback path to provide feedback to the second input stage; and
    the second input stage is configured to shut off the first pulse generator responsive to the feedback for self-timed operation.
4. The apparatus according to claim 1, wherein the first single track buffer and the second single track buffer each comprise a dual-rail single track full buffer.
5. The apparatus according to claim 4, wherein:
    a first rail of the bidirectional rails is for a true side; and
    a second rail of the bidirectional rails is for a false side.
6. The apparatus according to claim 5, wherein the bidirectional rails send and receive: data, an acknowledgement of receipt of the data, and a state of readiness to receive more of the data.
7. An apparatus, comprising:
    an input stage including a first input rail and a second input rail;
    an output stage coupled to the input stage;
    wherein the output stage includes a first output rail and a second output rail;
    wherein the input stage includes an input driver;
    wherein the output stage includes an output driver;
    a first feedback loop and a second feedback loop go from the output stage to the input stage;
    wherein each of the first feedback loop and the second feedback loop includes a first latch of the input stage; and
    wherein the input driver is controlled by output of the first latch.
8. The apparatus according to claim 7, wherein:
    a third feedback loop and a fourth feedback loop in the output stage respectively including a second latch and a third latch both of the output stage;
    the third feedback loop and the fourth feedback loop respectively are to reset the second latch and the third latch; and
    the output driver is controlled by outputs of the second latch and the third latch.
9. The apparatus according to claim 8, wherein:
    a fifth feedback loop and a sixth feedback loop are in the output stage; and
    the fifth feedback loop and the sixth feedback loop respectively are to set the second latch and the third latch.
10. The apparatus according to claim 9, wherein:
    the first latch comprises a first asymmetric C-element;
    the second latch comprises a second asymmetric C-element; and
    the third latch comprises a third asymmetric C-element.
11. The apparatus according to claim 10, wherein the first asymmetric C-element, the second asymmetric C-element, and the third asymmetric C-element comprise respective reset-dominant SR latches.
12. The apparatus according to claim 9, wherein:
    the input driver includes a first pull-up circuit and a second pull-up circuit respectively coupled the first input rail and the second input rail; and
    the first pull-up circuit and the second pull-up circuit are gated with output of the first latch.

13. The apparatus according to claim 9, wherein:
the output driver includes a first pull-down circuit and a second pull-down circuit respectively coupled to the first output rail and the second output rail; and
the first pull-down circuit and the second pull-down circuit are respectively gated with outputs of the second latch and the third latch.

14. The apparatus according to claim 9, wherein:
the first feedback loop and the second feedback respectively include a first gate output and a second gate output;
the fifth feedback loop and the sixth feedback loop respectively include the first gate output and the second gate output;
the first feedback loop and the fifth feedback loop are coupled such that a faster one thereof sets the second latch; and
the second feedback loop and the sixth feedback loop are coupled such that a faster one thereof sets the third latch.

15. An apparatus, comprising:
a first single track buffer including a first input stage and a first output stage, and
a second output stage is coupled to the first input stage;
wherein the first input stage includes a first input rail and a second input rail;
wherein the first output stage and the second output stage are coupled to the first input stage via a first fork of the first input rail and a second fork of the second input rail;
wherein the first output stage includes a first output rail and a second output rail;
wherein the second output stage includes a third output rail and a fourth output rail; and
wherein the first input rail, the second input rail, the first output rail, the second output rail, the third output rail, and the fourth output rail are all bidirectional.

16. The apparatus according to claim 15, wherein:
the first input stage includes an input driver;
the first output stage includes a first output driver; and
the second output stage includes a second output driver.

17. The apparatus according to claim 16, wherein:
a first feedback loop and a second feedback loop extend from the first output stage to the first input stage;
a third feedback loop and a fourth feedback loop extend from the second output stage to the first input stage;
the first feedback loop, the second feedback loop, the third feedback loop, and the fourth feedback loop are all commonly gated to provide a set control to a latch;
the first input stage includes the latch; and
the input driver is controlled by output of the latch.

18. The apparatus according to claim 15, further comprising:
a second single track buffer including a second input stage and the second output stage; and
wherein the second input stage includes a third input rail and a fourth input rail.

19. The apparatus according to claim 18, wherein:
the first output stage and the second output stage are coupled to the first input stage via the first fork of the first input rail via a first demultiplexer and the second fork of the second input rail via a second demultiplexer; and
the first output stage and the second output stage are coupled to the second input stage via a third fork of the third input rail via a third demultiplexer and a fourth fork of the fourth input rail via a fourth demultiplexer.

20. The apparatus according to claim 19, wherein the third input rail and the fourth input rail are both bidirectional.

* * * * *